United States Patent [19]

Ostrem

[11] Patent Number: 4,796,157
[45] Date of Patent: Jan. 3, 1989

[54] SUBSTRATE MOUNTING ASSEMBLY
[75] Inventor: Fred E. Ostrem, Long Grove, Ill.
[73] Assignee: Motorola, Inc., Schaumburg, Ill.
[21] Appl. No.: 140,458
[22] Filed: Jan. 4, 1988
[51] Int. Cl.⁴ .............................................. H05K 7/20
[52] U.S. Cl. .................................. 361/386; 165/185; 174/16.3; 357/81; 361/388
[58] Field of Search ........................... 165/80.3, 185; 174/16 HS, 52 FP; 357/80, 81; 361/386–389, 392, 394

[56] References Cited
FOREIGN PATENT DOCUMENTS
2516006 11/1975 Fed. Rep. of Germany ...... 361/387

OTHER PUBLICATIONS
Motorola TFI-IV Assembly Drawing.

Primary Examiner—A. D. Pellinen
Assistant Examiner—Gregory D. Thompson
Attorney, Agent, or Firm—Phillip H. Melamed

[57] ABSTRACT

In a substrate mounting assembly (10) critical bonding pads (20) adjacent one lateral edge (21) of a ceramic substrate (11) are connected to semiconductor die (13) via wires (26). The substrate and die are mounted on a aluminum base carrier plate (12) which serves as a heat sink for the semiconductor die. A relatively rigid first adhesive (40) is applied in one area between the substrate and base carrier so as to effectively fix one lateral edge (21) of the substrate and the critical bonding pads (20) with respect to the base carrier, while a second adhesive (41), comprising an acrylic adhesive tape, bonds other areas of the ceramic substrate to the base carrier. At a lateral edge (23) of the substrate opposite to the lateral edge (21) adjacent the critical bonding pads, additional bonding pads (22) are provided and wires/conductors (27) connect these additional bonding pads to lead frame projections (28) from a non-conductive housing (29) fixed to the aluminum base carrier. This configuration insures sufficient mechanical support for the ceramic substrate while also providing minimal stress for the wires connecting the semiconductor die to the critical bonding pads.

18 Claims, 2 Drawing Sheets

SUBSTRATE MOUNTING ASSEMBLY

BACKGROUND OF THE PRESENT INVENTION

The invention relates generally to the field of assemblies in which a substrate is mounted to a base carrier, and more particularly to the mounting of a metallized substrate having conductor paths on it to a base carrier having a substantially different temperature coefficient of expansion than the substrate.

In prior substrate mounting assemblies metallized ceramic substrates have been mounted to metal base carrier plates. The term "plate" as used herein refers to structure having top and bottom surfaces with a relatively thin dimension therebetween as compared to peripheral dimensions of the top and bottom surfaces. In some of these assemblies, semiconductor devices separately mounted and fixed with respect to a metal base carrier plate have been connected by wire bonds to bonding pads on the metallized substrate, while additional bonding pads on the substrate have had wires connecting these additional pads to lead frame projections in a housing fixed to the metal carrier plate. In such prior assemblies, typically the largest lateral dimension of the ceramic substrate was no more than one and a half inches. In such a situation, many different types of mounting techniques for attaching the substrate to the metal base carrier plate were utilized and provided satisfactory results since vibration and thermal expansion problems were not severe.

One of the above-noted prior mounting assembly techniques comprised providing a compliant adhesive urethane or acrylic adhesive tape over substantially the entire bottom surface of the substrate and between the substrate and carrier. Another of these prior substrate mounting techniques utilized a rigid adhesive to positively fix one edge of the substrate at which the bonding pads for the semiconductor die wires were to be attached while providing no support for the remaining portion of the substrate. However, neither of the above-described techniques are suitable for mounting metallized ceramic substrates having a substantially larger lateral dimension such as two inches or more. In such a case, fixing one edge of the substrate by a rigid adhesive while providing no support to the other end provides an unsatisfactory assembly which cannot pass mechanical vibration tests. Also, the providing of no support to a portion of the substrate hinders bonding wires to bonding pads at the unsupported end of the substrate. The use of a compliant adhesive over the entire substrate also does not provide a satisfactory bonding technique for large substrates. This is because movement, with respect to the base carrier, of the bonding pads at which the semiconductor die wires are bonded will induce mechanical fatigue in these wires and cause rupturing of these wires. This movement is caused by the thermal mismatch between the substrate and the metal base carrier. Applying a rigid adhesive over the entire bottom surface of the substrate also does not work since this will result in either cracks in the ceramic substrate or an adhesive bond failure due to the thermal expansion mismatch between the substrate and the carrier.

SUMMARY OF THE INVENTION

An object of the present invention is to provide an improved substrate mounting assembly which overcomes the above-noted disadvantages of the prior substrate mounting assemblies.

A more specific object of the present invention is to provide an improved substrate mounting assembly comprising: a substrate having a plate-shaped configuration with a top surface having metallized conductor paths and bonding pads thereon and a bottom surface; a base carrier having a top surface to which said substrate bottom surface is to be bonded to, said base carrier having a substantially different temperature coefficient of expansion than said substrate; first adhesive means bonding a portion of said substrate bottom surface adjacent at least one critical one of said bonding pads to said base carrier top surface to effectively fix the position of said critical bonding pad with respect to said base carrier; and second adhesive means bonding other portions of said substrate bottom surface to said base carrier top surface, said second adhesive means forming a substantially more compliant and flexible bond between said substrate and said base carrier than said first adhesive means.

Preferably, a metallized ceramic substrate is bonded to a metal base carrier plate by the use of two different adhesives. A first relatively rigid adhesive is utilized to effectively fix a lateral edge of the substrate so that critical bonding pads are maintained in a relatively-fixed position with respect to semiconductor dies that are fixed to the metal base carrier. This insures a minimum of stress being applied during thermal cycling to bonded wire connected between the critical bonding pads and the semiconductor die. In addition, other portions of the substrate are mounted to the metal base carrier by a second adhesive which forms a substantially more compliant and flexible bond than the more rigid adhesive used to bond the portions of the substrate adjacent the critical bonding pads. This second more compliant adhesive will provide vertical support for the ceramic substrate while still allowing some lateral movement, whereas the first adhesive essentially fixes the critical bonding pads with respect to the metal carrier plate and minimizes the movement of these pads with respect to the semiconductor die. This provides a minimum amount of stress for the typically thin diameter bonding wires connecting the die to the critical bonding pads which are typically located adjacent one lateral edge of the ceramic substrate. At an opposite lateral edge of the ceramic substrate additional non-critical bonding pads are preferably provided. Connections are made from these additional bonding pads to lead frame projections extending from a non-conductive housing structure to which the metal base carrier plate is mounted. The electrical connections between the lead frame projections and these additional bonding pads typically comprise larger and more durable connections than the semiconductor die bonding wires, and therefore eliminating stress in these lead frame connections is not as critical as eliminating stress from the thin bonding wires connected to the semiconductor die.

By use of the present invention a substrate mounting assembly is provided in which a ceramic substrate can withstand substantial vibration while also enduring temperature extremes without the rupturing of electrical interconnection wire bonds between the substrate and other elements. This is accomplished despite the substantial mismatch in thermal expansion coefficients between the substrate and the metal base carrier. In addition, providing support to the substrate over substantially the entire substrate minimizes the likelihood of substrate breakage during the manufacturing process of such an assembly when connecting wires to the lateral edge that is opposite to the lateral edge at which the critical bonding pads are provided. The preceding objectives, advantages and operation of the present invention, as well as other additional advantages, can best be understood by reference to the following more detailed description of the present invention.

BRIEF DESCRIPTION OF THE DRAWINGS

For a more complete understanding of the present invention, reference should be made to the drawings, in which.

DESCRIPTION OF THE PREFERRED EMBODIMENTS

Figure 1:
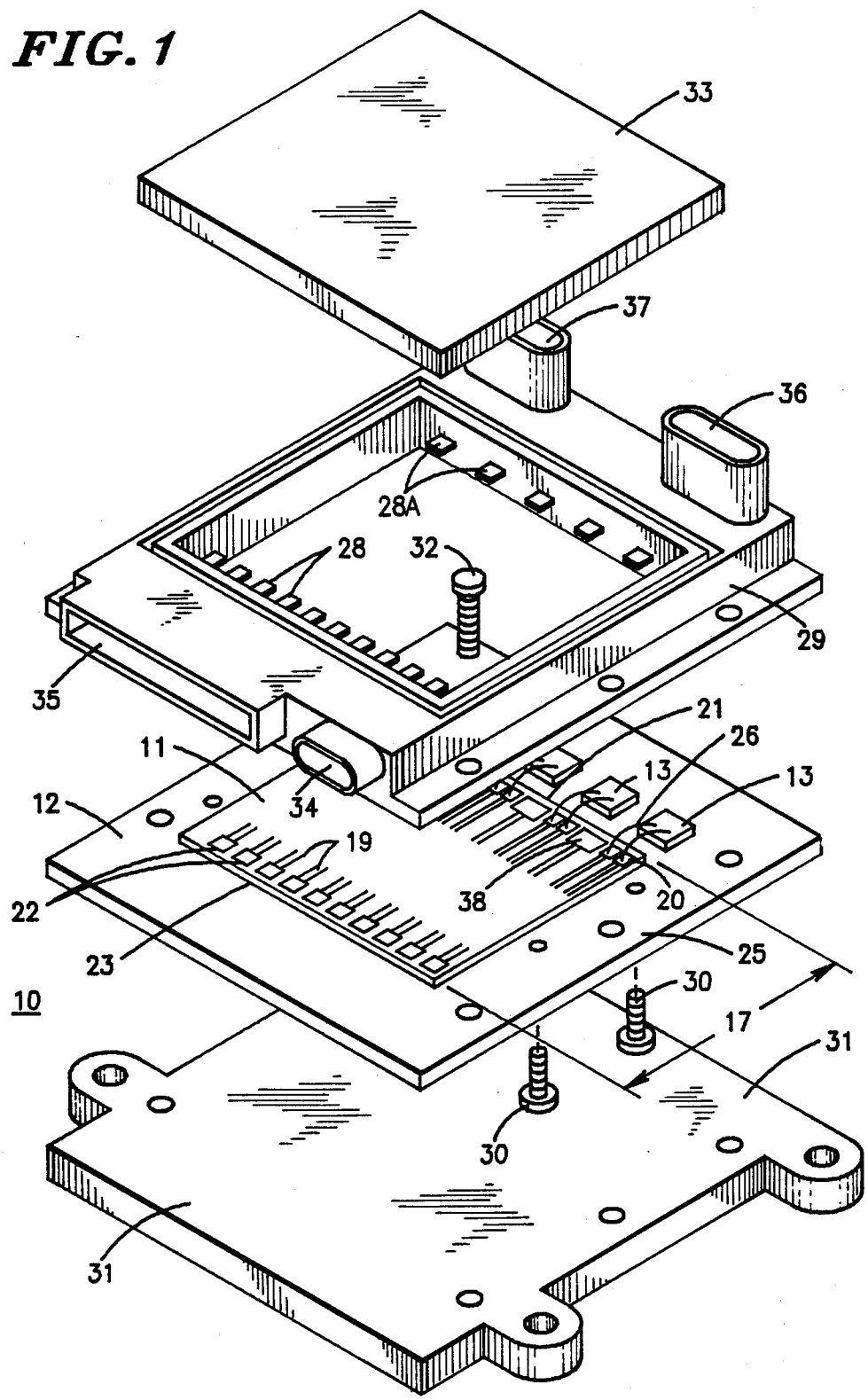
FIG. 1 is an exploded perspective assembly view of a substrate mounting assembly constructed in accordance with the present invention.
Figure 2:
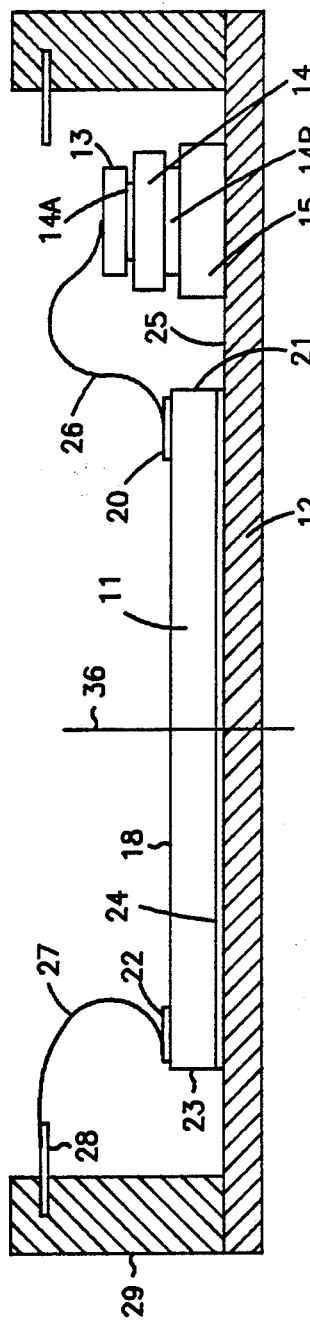
FIG. 2 comprises a vertically enlarged cross-sectional view of a portion of the assembly shown in FIG. 1.

Referring to FIG. 1, an improved substrate mounting assembly 10 is illustrated in which a metallized ceramic substrate 11 is mounted to an aluminum base carrier plate 12. In addition, a plurality of semiconductor die 13 are each mounted, separately from said ceramic substrate 11, to the aluminum base carrier 12 via some suitable thermally conductive mounting structure. This thermal conductive mounting structure can comprise, as is best shown in FIG. 2, an electrically insulating and thermally conductive ceramic carrier 14, such as beryllium oxide (BeO). The carrier 14 has a top conductive metallization layer 14A to which the semiconductor die 13 is mounted with a bottom conductive metallization layer 14B fixing the ceramic carrier 14 to a copper slug 15 directly mounted, by ultrasonic bonding, to the aluminum base carrier 12. In such a structure, the metal base carrier 12 forms a heat sink for the semiconductor die 13, as well as providing some potential heat sinking capability for the ceramic substrate 11. This die mounting structure fixes the position of the relatively small dimension die with respect to the metal base carrier 12. Preferably, the ceramic substrate 11 comprises an alumina ($Al_2O_3$) substrate which has at least one lateral dimension 17 that is at least two inches. In the preferred embodiment of the present invention the substrate 11 comprises a three-inch square alumina plate having a typical thickness dimension of 0.025 inches.

The alumina substrate 11 has a planar top surface 18 having a plurality of metallized conductor paths 19 thereon, a plurality of metallized critical bonding pads 20 thereon adjacent a first lateral edge 21 of the substrate and a plurality of additional non-critical bonding pads 22 adjacent an opposite lateral edge 23 of the substrate 11. The substrate 11 has a planar bottom surface 24 opposite the top surface 18. The aluminum base carrier 12 has a planar top surface 25 to which the substrate bottom surface 24 is to be bonded to. Typically a number of discrete components (not shown) are mounted on the substrate top surface 18.

The critical bonding pads 20 on the ceramic substrate 11 are connected to bonding areas on the semiconductor die 13 by associated bonding wires 26 which typically comprise relatively thin diameter aluminum or gold wires typically 0.001 to 0.010 inches in diameter. In addition, as shown in FIG. 2, the additional non-critical bonding pads 22 on the substrate 11 are connected via some thicker and more mechanically substantial electrical connections 27, which can comprise thicker bonded wires, conductor strips or ribbon conductors, to lead frame projections 28. The projections 28 are embedded in and extend from a non-conductive housing 29 which is rigidly fixed to the metal base carrier 12 via mounting screws 30. In addition, a substantially larger heat sink plate 31 is mounted on the underside of the aluminum base carrier 12 and fixed to the housing 29 by additional mounting screws 32. A snap-on plastic cover 33 is applied on top of the housing 29 for protection of the semiconductor die 13 and metallized ceramic substrate 11. External electrical connection to the assembly 10 is provided by exposed connector pins which are molded into the housing 29 so as to form connector plug/socket assemblies generally indicated by the reference numerals 34, 35 36 and 37. It should be noted that in assembly 10 some lead frame projections 28A may also be connected to bonding pads 38, adjacent the critical pads 20, via additional associated connections identical to connections 27.

Essentially, the present invention has realized that when constructing an assembly such as the assembly 10 described above and shown in FIGS. 1 and 2, substantial problems are encountered when the ceramic substrate lateral dimension 17 is relatively large such as 2 inches or more. While these problems exist even for smaller lateral dimension ceramic substrates, they are not as noticeable and therefore have not required the use of the present invention to insure reliability. The problems which are encountered basically result from the substantial difference in the temperature coefficient of thermal expansion of the ceramic substrate 11 with respect to the temperature coefficient of thermal expansion of the metal substrate 12. Typically vastly different thermal coefficients exist for these two components. If a rigid epoxy were to be used to bond the substrate 11 to the aluminum base carrier 12 over substantially the entire bottom surface 24, clearly under extreme temperature cycling the ceramic substrate would crack or the epoxy bond would fail. Either condition would result in an unreliable electrical module. One prior assembly, dealing with a ceramic substrate having a lateral dimension 17 of only one and a half inches, proposed to solve this problem by applying epoxy only essentially beneath and adjacent the critical bonding pads 20. This fixed these bonding pads with respect to the aluminum base carrier 12 and thereby minimized stress provided to the wires 26 which may be incurred during temperature cycling. However, this prior assembly, recognizing that applying a uniform epoxy over the entire bottom surface 24 was not desirable, then left the remaining portion of the substrate 11 unsupported. Because of this, the prior assembly was unable to utilize conventional soldering techniques for bonding the wires/conductors 27 to the non-critical bonding pads 22 since mechanical pressure could not be applied directly to the substrate 11 at the bonding pads 22 during the soldering process. Thus, complex soldering techniques had to to be developed which avoided substantial mechanical contact pressure at the pads 22 during the soldering process. In addition, the mechanical integrity of the resultant structure was somewhat compromised since the stability of the structure under vibration would be jeopardized unless the connections 27 were now made rigid. Rigidizing these connections just means that these connections are liable to be ruptured during vibration, and thus the resultant assembly, while marginally satisfactory for smaller ceramic substrates, could not provide a reliable large substrate assembly.

Another prior assembly similar to the present assembly 10 has also been utilized for mounting relatively small ceramic substrates to the aluminum carrier 12. This assembly provided a compliant adhesive over substantially all of the bottom surface 24. This type of configuration did provide support beneath the non-critical bonding pad areas 22 such that conventional soldering techniques for the connections 27 could be utilized. Such conventional soldering techniques comprise the use of a soldering iron or an electrical pulse bonding soldering tip, both of which would contact and apply mechanical pressure to the additional bonding pads 22 during the soldering operation. However, this solution, while providing satisfactory performance for small substrates, is not adaptable for reliably bonding large substrates. For large substrates in the assembly 10, substantially larger mechanical stresses would be provided for the wires 26 during thermal cycling. This can best be envisioned by referring to FIG. 2 in which a theoretical stationary center line 36 of the substrate 11 is illustrated. With just a uniform compliant adhesive applied between the bottom surface 24 and the top surface 25, the lateral edge 21 will have substantial relative movement with respect to the semiconductor die 13 which are rigidly fixed to the carrier 12. This is because each will move differently with respect to the stationary theoretical center line 36 during temperature cycling. This will transmit stress to the bonding wires 26 and eventually result in mechanical fatigue and failure of these wires. For ceramic substrates 11 having a relatively small dimension 17, the amount of stress transmitted to the wires 26 may be negligible. However, for substantially larger ceramic substrates, this presents a problem since substantially larger stresses will be transmitted to the wires 26 causing eventual failure. This is because the die 13 will essentially be rigidly fixed to the metal carrier 12 while the lateral edge 21 of the substrate will move with respect to the aluminum base carrier 12.

Figure 3:
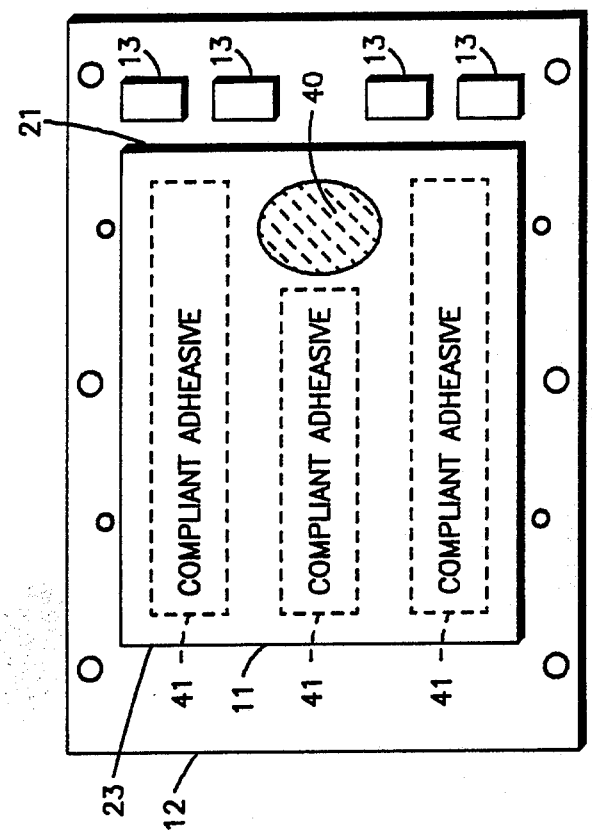
FIG. 3 comprises a top planar view of a portion of the assembly shown in FIG. 1.

To avoid the above-noted problems with the prior bonding techniques, the present invention essentially utilizes two different adhesives. A first rigid adhesive 40 bonds a portion of the substrate bottom surface 24 effectively beneath and adjacent the critical bonding pads 20 to the base carrier top surface 25. In addition, a second adhesive 41 bonds other portions of the substrate bottom surface 24 to the base carrier top surface 25 so as to provide mechanical support for the substrate 11 beneath the non-critical bonding pads 22. Preferably, the adhesive 40 comprises a semi-rigid silicone adhesive such as Dow Corning silicone adhesive 6605, whereas the compliant adhesive 41 comprises three strips of either adhesive urethane or an acrylic adhesive tape. Preferably, the rigid adhesive 40 and the compliant adhesive 41 are applied in the configuration shown in FIG. 3 in which, for purposes of clarity, the metallizations and components on the top surface 18 of the substrate 11 are not shown, while the patterns for the adhesives 40 and 41 are shown in phantom. It should be noted that the compliant adhesive 41 forms a substantially more compliant and flexible bond between the substrate 11 and the base carrier plate 12 than the more rigid adhesive 40.

By use of the present invention, the rigid adhesive 40 effectively fixes the location of the lateral edge 21 with respect to the semiconductor die 13 that are fixed to the plate 12. This will insure minimum stress being provided to the thin bonding wires 26 during temperature excursions. In addition, the compliant adhesive 41 provides needed support for the substrate 11 such that mechanical support is provided beneath and effectively adjacent the non-critical bonding pads 22 located at the opposite lateral edge 23. This provides improved vibration integrity to the assembly 10 while also permitting the use of conventional contact soldering techniques for forming the solder connection between the pads 22 and wire/conductors 27. In addition, because mechanical integrity to this assembly is now provided by the compliant adhesive beneath the pads 22, more flexible connections 27 can be utilized in the present invention since these connections do not have to provide the mechanical support for the substrate 11 at the lateral edge 23. This means that more reliable connections can be implemented by the wires/conductors 27 since if these are flexible, they can better withstand the differences in position which will exist between the lead frame projections 28 and the bonding pads 22 during temperature cycling.

While I have shown and described specific embodiments of this invention, further modifications and improvements will occur to those skilled in the art. All such modifications which retain the basic underlying principles disclosed and claimed herein are within the scope of this invention.

I claim:

1. A substrate mounting assembly comprising:
    a substrate having a plate-shaped configuration with a top surface having metallized conductor paths and bonding pads thereon and a bottom surface;
    a base carrier having a top surface to which said substrate bottom surface is to be bonded to, said base carrier having a substantially different temperature coefficient of expansion than said substrate;
    first adhesive means bonding a portion of said substrate bottom surface adjacent at least one critical one of said bonding pads to said base carrier top surface to effectively fix the position of said critical bonding pad with respect to said base carrier; and
    second adhesive means bonding other portions of said substrate bottom surface to said base carrier top surface, said second adhesive means forming a substantially more compliant and flexible bond between said substrate and said base carrier than said first adhesive means.

2. A substrate mounting assembly according to claim 1 wherein said first adhesive means is applied adjacent a lateral edge of said substrate to effectively fix said edge with respect to said base carrier, and wherein a plurality of critical ones of said bonding pads are located adjacent said lateral edge of said substrate.

3. A substrate mounting assembly according to claim 2 which includes wires connecting associated ones of said critical bonding pads to at least one semiconductor die mounted separate from said substrate.

4. A substrate mounting assembly according to claim 3 wherein said base carrier comprises a thermally conductive material and wherein said semiconductor die is mounted on said base carrier top surface with a bottom surface of said die effectively coupled to said base carrier top surface in thermal conducting relationship thereto.

5. A substrate mounting assembly according to claim 1 which includes at least one wire bonded at one portion thereof to said one critical bonding pad and at another portion of said wire to a bonding area separate from said substrate and fixed with respect to said base carrier.

6. A substrate mounting assembly according to claim 5 wherein said separate bonding area is on a device mounted to said base via a mounting structure separate from said substrate.

7. A substrate mounting assembly according to claim 6 wherein said base carrier comprises a heat sink and wherein said device is mounted in thermal conducting relationship to said heat sink.

8. A substrate mounting assembly according to claim 7 wherein said second adhesive means comprises one of a group consisting of a compliant adhesive urethane material and an acrylic adhesive tape.

9. A substrate mounting assembly according to claim 8 wherein said first adhesive means comprises a silicone adhesive providing a semi-rigid bond between said substrate and said base carrier, said second adhesive means still providing a substantially more compliant and flexible bond between said substrate and base carrier than said silicone adhesive.

10. A substrate mounting assembly according to claim 6 wherein said substrate is constructed of a ceramic material and said base carrier is constructed of a thermally and electrically conductive metal.

11. A substrate mounting assembly comprising:
a substrate having a plate-shaped configuration with a top surface having metallized conductor paths and bonding pads thereon and a bottom surface;
a base carrier having a top surface to which said substrate bottom surface is to be bonded to, said base carrier having a substantially different temperature coefficient of expansion than said substrate;
first adhesive means bonding a portion of said substrate bottom surface adjacent at least one critical one of said bonding pads to said base carrier top surface to effectively fix the position of said critical bonding pad with respect to said base carrier;
second adhesive means bonding other portions of said substrate bottom surface to said base carrier top surface, said second adhesive means forming a substantially more compliant and flexible bond between said substrate and said base carrier than said first adhesive means;
said critical one of said bonding pads located adjacent one lateral edge of said substrate, and at least a non-critical one of said bonding pads located adjacent an opposite lateral edge of said substrate;
a wire bonded at one portion thereof to said critical bonding pad and at another portion of said wire to a bonding area separate from said substrate and fixed with respect to said base carrier; and
a wire/conductor having a portion bonded to said non-critical bonding pad and having another portion bonded to a lead frame bonding area separate from said substrate and fixed with respect to said base carrier.

12. A substrate mounting assembly according to claim 11 wherein said lead frame bonding area comprises a conductor embedded in and extending from a non-conductive housing fixed to said base carrier, and wherein said wire bonded to said critical bonding pad connects said critical bonding pad to a semiconductor die mounted to said base carrier which provides a heat sink for said semiconductor die.

13. A substrate mounting assembly according to claim 11 wherein said substrate is constructed of a ceramic material and wherein said base carrier comprises an aluminum plate.

14. A substrate mounting assembly according to claim 12 wherein said ceramic substrate has a dimension between said lateral edges of at least two inches.

15. A substrate mounting assembly according to claim 14 wherein said first adhesive means is applied adjacent said lateral edge adjacent said critical bonding pad to effectively fix said edge with respect to said base carrier, and wherein a plurality of critical ones of said bonding pads are located adjacent said lateral edge of said substrate adjacent said one critical bonding pad.

16. A substrate mounting assembly according to claim 15 which includes a plurality of wires connecting associated ones of said critical bonding pads to at least one semiconductor die mounted separate from said substrate.

17. A substrate mounting assembly according to claim 16 wherein said base carrier comprises a thermally conductive structure and wherein said semiconductor die is mounted on said base carrier top surface with a bottom surface of said die effectively coupled to said base carrier top surface in thermal conducting relationship thereto.

18. A substrate mounting assembly according to claim 17 wherein said second adhesive means comprises one of a group consisting of a compliant adhesive urethane material and an acrylic adhesive tape.

* * * * *